(12) United States Patent
Zhong et al.

(10) Patent No.: US 7,372,121 B2
(45) Date of Patent: May 13, 2008

(54) GEBPSG TOP CLAD FOR A PLANAR LIGHTWAVE CIRCUIT

(75) Inventors: Fan Zhong, Fremont, CA (US); Michael Lennon, Union City, CA (US)

(73) Assignee: NeoPhotonics Corporation, San Jose, CA (US)

( * ) Notice: Subject to any disclaimer, the term of this patent is extended or adjusted under 35 U.S.C. 154(b) by 7 days.

(21) Appl. No.: 11/591,085

(22) Filed: Nov. 1, 2006

(65) Prior Publication Data

US 2007/0047889 A1 Mar. 1, 2007

Related U.S. Application Data

(62) Division of application No. 09/917,438, filed on Jul. 27, 2001, now Pat. No. 7,160,746.

(51) Int. Cl.
*H01L 31/0232* (2006.01)
*G02B 6/10* (2006.01)

(52) U.S. Cl. .................. 257/432; 385/129; 385/132

(58) Field of Classification Search .............. 257/98, 257/432; 385/129, 130, 131, 132
See application file for complete search history.

(56) References Cited

U.S. PATENT DOCUMENTS

| | | |
|---|---|---|
| 4,111,525 A | 9/1978 | Kaminow et al. |
| 4,327,965 A | 5/1982 | Black |
| 4,335,934 A | 6/1982 | Black et al. |
| 5,280,535 A | 1/1994 | Gfeller et al. |
| 5,408,569 A | 4/1995 | Nishimoto |
| 5,648,175 A | 7/1997 | Russell et al. |
| 5,663,556 A | 9/1997 | Wessels et al. |
| 5,678,935 A | 10/1997 | Sakata |
| 5,728,605 A | 3/1998 | Mizutani |
| 5,757,540 A | 5/1998 | Judkins et al. |
| 5,763,081 A | 6/1998 | Ohga et al. |
| 5,885,881 A | 3/1999 | Ojha |
| 5,904,491 A | 5/1999 | Ojha et al. |
| 5,930,435 A | 7/1999 | Laming et al. |
| 5,982,973 A | 11/1999 | Yan et al. |
| 6,058,231 A | 5/2000 | Haggans et al. |
| 6,108,474 A | 8/2000 | Eggleton et al. |
| 6,122,429 A | 9/2000 | Wessels et al. |
| 6,201,918 B1 | 3/2001 | Berkey et al. |

(Continued)

*Primary Examiner*—W. David Coleman
(74) *Attorney, Agent, or Firm*—Bardi & Associates, PLLC; Peter S. Dardi

(57) ABSTRACT

A method of depositing a top clad layer for an optical waveguide of a planar lightwave circuit. A GeBPSG top clad layer for an optical waveguide structure of a planar lightwave circuit is fabricated such that the top clad layer comprises doped silica glass, wherein the dopant includes Ge (Germanium), P (Phosphorus), and B (Boron). In depositing a top clad layer for the optical waveguide, three separate doping gasses (e.g., $GeH_4$, $PH_3$, and $B_2H_6$) are added during the PECVD (plasma enhanced chemical vapor deposition) process to make Ge, P and B doped silica glass (GeBPSG). The ratio of the Ge, P, and B dopants is configured to reduce the formation of crystallization areas within the top clad layer and maintain a constant refractive index within the top clad layer across an anneal temperature range. A thermal anneal process for the top clad layer can be a temperature within a range of 950 C to 1050 C. The GeBPSG top clad layer reduces the insertion loss of passive arrayed waveguide grating devices and active planar lightwave circuit devices.

14 Claims, 11 Drawing Sheets

U.S. PATENT DOCUMENTS

| | | |
|---|---|---|
| 6,208,792 B1 | 3/2001 | Hwang et al. |
| 6,317,444 B1 | 11/2001 | Chakrabarti et al. |
| 6,615,615 B2 | 9/2003 | Zhong et al. |
| 6,705,124 B2 | 3/2004 | Zhong et al. |
| 2002/0021882 A1 | 2/2002 | Wyatt et al. |
| 2002/0154878 A1 | 10/2002 | Akwani et al. |

GEBPSG TOP CLAD FOR A PLANAR LIGHTWAVE CIRCUIT

CROSS REFERENCE TO RELATED APPLICATIONS

This application is a divisional application of U.S. patent application Ser. No. 09/917,438, filed Jul. 27, 2001 now U.S. Pat. No. 7,160,746 to Zhong et al., entitled "A GeBPSG Top Clad for a Planar Lightwave Circuit," incorporated herein by reference.

FIELD OF THE INVENTION

The present invention relates generally to planar lightwave circuits. More particularly, the present invention relates to a method for growing an optical waveguide top cladding layer by plasma enhanced chemical vapor deposition (PECVD) with better gap filling capability and refractive index control.

BACKGROUND OF THE INVENTION

Planar lightwave circuits comprise fundamental building blocks for the modern fiber optic communications infrastructure. Planar lightwave circuits are generally devices configured to transmit light in a manner analogous to the transmission of electrical currents in printed circuit boards and integrated circuit devices. Examples include arrayed waveguide grating devices, integrated wavelength multiplexers/demultiplexers, optical switches, optical modulators, wavelength-independent optical couplers, and the like.

Planar lightwave circuits generally involve the provisioning of a series of embedded optical waveguides upon a semiconductor substrate (e.g., silicon), with the optical waveguides fabricated from one or more silica layers formed on the underlying semiconductor substrate. Fabrication techniques required for manufacturing planar lightwave circuits using silica are generally well known.

Prior art FIG. 1 shows a cross-section view of two planar optical waveguides of a conventional PLC. As depicted in FIG. 1, the planar optical waveguides include two doped $SiO_2$ glass cores 10a-10b formed over a $SiO_2$ bottom cladding layer 12 which is on a silicon substrate 13. A $SiO_2$ top cladding layer 11 covers both the cores 10a-b and the bottom cladding layer 12. As described above, the refractive index of the cores 10a-b is higher than that of top cladding layer 11 and the bottom clad 12. Consequently, optical signals are confined axially within cores 10a-b and propagate lengthwise through cores 10a-b.

There are a number of problems with the prior art fabrication process for the PLC shown in FIG. 1. One problem is the formation of crystallization areas within top cladding layer 11. Crystallization areas tend to form in the low density areas of the top cladding layer. Such low density areas are typically found in the high aspect ratio gaps, such as the gap between cores 10a-b.

Top cladding layer 11 is typically an $SiO_2$ layer doped with a Phosphorus dopant and a Boron dopant (e.g., BPSG). Those two dopants decrease the reflow temperature of BPSG and able to adjust the refractive index such that it matches the refractive index of bottom cladding layer 13. The problem is the fact that during the PECVD (plasma enhanced chemical vapor deposition) process for top cladding layer 11, the top cladding layer material deposited between cores 10a-b tends to form seams or voids. To overcome this problem, top cladding layer 11 is gradually built-up through a number of deposition and anneal cycles. This gradual top cladding layer build up process can fill the gap between cores 10a-b without forming voids, however, there are often low density areas in such gaps, where the material of top cladding layer 11 is less dense than in other areas. These low density areas lead to the formation of crystals. The Phosphorus and Boron dopants form $BPO_4$ crystals in the low density areas of the silica matrix.

Prior art FIGS. 2A and 2B show a side cutaway photograph of 10 waveguide cores 20, top cladding layer 21, and $BPO_4$ crystallization areas 22. FIG. 2A shows a case where there is a two micron gap between cores 20. FIG. 2B shows a case where there is a four micron gap between cores 20. The $BPO_4$ crystals between cores 20 can significantly degrade the performance of the PLC, and particularly, active devices such as coupler PLCs wherein the geometry (e.g., the distance between cores 20) and the material properties of top cladding layer 21 between cores 20 are critical to the performance of the coupler.

Prior art FIG. 3 shows a top-down view of a coupler PLC. As depicted in FIG. 3, cores 10a-b form a coupling region wherein the distance between cores 10a-b and the material properties (e.g., consistent refractive index, uniformity, etc.) of the top cladding layer need to be precisely controlled. The top cladding layer between cores 10a-b in the coupling region needs free of crystallization.

A second problem is refractive index control of the top cladding layer. As multiple lots of PLC devices are fabricated, it is difficult to maintain a consistent refractive index across the lots. Prior art BPSG top cladding layers are very sensitive with respect to anneal temperature and the Boron and Phosphorus dopant ratios. As described above, multiple deposition and anneal cycles are required to fill the high aspect ratio gaps. For example, there are typically at least six deposition/anneal cycles for top clad deposition for arrayed waveguide grating PLCs. Active PLC devices require at least seven top clad deposition/anneal cycles. The multiple deposition/anneal cycles introduce more thermal impacts on the cores (e.g., which can cause core deformation and shrinkage) and on the first few layers of the top clad. The multiple high temperature anneal cycles makes the refractive index hard to control due to migration of Phosphorus atoms. Additionally, high anneal temperatures require an extra 10 percent phosphorus dopant gas flow (e.g., $PH_3$) to place top clad refractive index within the correct range. This high phosphorus concentration in BPSG is the major source of refractive index variation from lot to lot.

A third problem is the fact that the large number of deposition/anneal cycles reduces the yield of the PLC device fabrication process. As described above, to reduce crystallization problems, six or more deposition/anneal cycles are used for AWG devices and seven or more deposition/anneal cycles are used for active PLC devices (e.g., couplers, etc.). The large number of deposition/anneal cycles increases the amount of time required to fabricate the PLC devices.

Thus what is required is a solution that eliminates the formation of crystallization areas within the top cladding layer of a PLC device. What is required is a solution that provides a predictable and stable refractive index for the top cladding layer of a PLC device and renders the refractive index of the top cladding layer less sensitive to variation in the annealing procedure. What is further required is a solution that reduces the number of deposition/anneal cycles required to fabricate AWG PLC devices and active PLC devices. The present invention provides a novel solution to the above requirements.

SUMMARY OF THE INVENTION

The present invention is a method of depositing a germanoborophosphosilicate glass (GeBPSG) top clad layer for an optical waveguide of a planar lightwave circuit. The present invention eliminates the formation of crystallization areas within the top clad layer and increases the refractive index stability of the top clad layer across an anneal temperature range. The present invention reduces the number of deposition/anneal cycles required to fabricate AWG PLC devices and active PLC devices.

In one embodiment, the present invention is implemented as a method of controlling the flow rates of three doping gases, a Ge dopant gas (e.g., $GeH_4$), a P dopant gas (e.g., $PH_3$), and a B dopant gas (e.g., $B_2H_6$) during top clad layer deposition for an optical waveguide of a planar lightwave circuit, to make a germanoborophosphosilicate glass (GeBPSG) top clad layer. The GeBPSG top clad layer for an optical waveguide of a planar lightwave circuit is fabricated by PECVD such that the top clad layer comprises three doping phases, $GeO_2$, $P_2O_5$, and $B_2O_3$ within a $SiO_2$ matrix. The flow rates of the Ge dopant, the P dopant, and the B dopant are controlled to form the GeBPSG top clad layer having precisely determined ratios of $GeO_2$, $P_2O_5$, and $B_2O_3$.

Both $GeO_2$ and $P_2O_5$ in $SiO_2$ increase the refractive index. To keep the refractive index in target, the amount of $P_2O_5$ has to be reduced if $GeO_2$ is in the top clad material. The reduced concentration of $P_2O_5$ in comparison to prior art eliminates the formation of crystallization areas within the top clad layer and increases the refractive index stability of the top clad layer across an anneal temperature range. Elimination of crystallization in top clad also reduces the number of deposition/anneal cycles required to fabricate AWG PLC devices and active PLC devices (e.g., couplers). The reduced amount of $P_2O_5$ (in comparison to a PSG-only doped top clad layer) significantly reduces the refractive index sensitivity of the top clad layer to anneal temperature.

BRIEF DESCRIPTION OF THE DRAWINGS

The present invention is illustrated by way of example and not by way of limitation, in the Figures of the accompanying drawings and in which like reference numerals refer to similar elements and in which.

Prior art

Prior art

Prior art

Prior art

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Embodiments of the present invention are directed towards a method of depositing a GeBPSG top cladding layer for an optical waveguide of a planar lightwave circuit. The present invention eliminates the formation of crystallization areas within the top cladding layer and increases the refractive index stability of the top cladding layer across an anneal temperature range. The present invention reduces the number of deposition/anneal cycles required to fabricate AWG PLC devices and active PLC devices. The present invention and its benefits are further described below.

Figure 1:
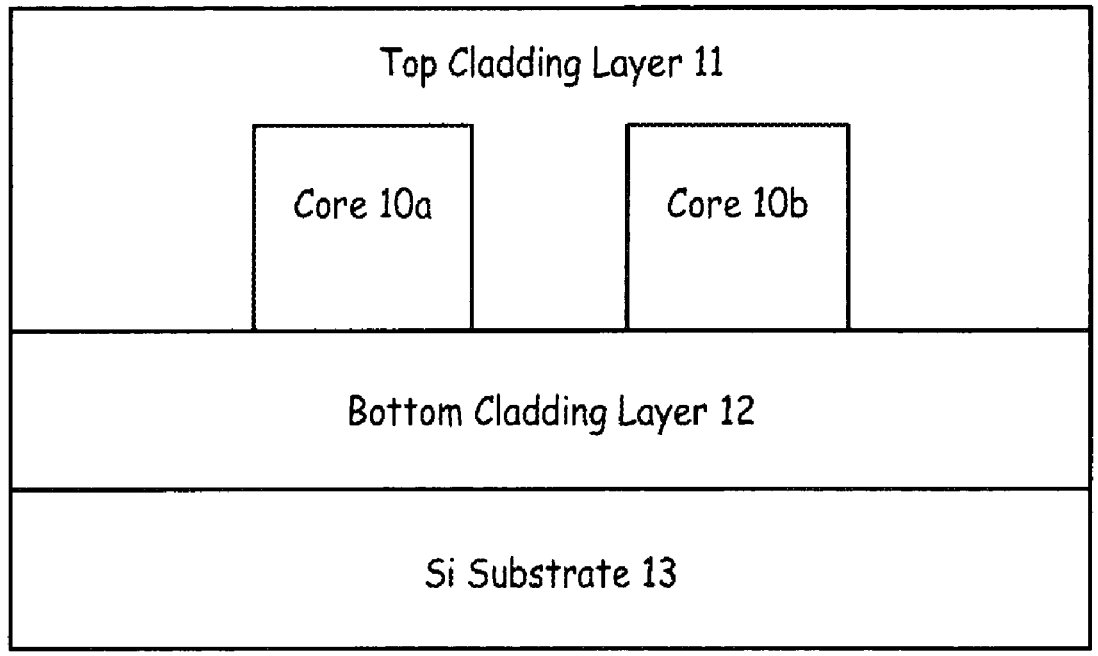
FIG. 1 shows a cross-section view of a conventional planar optical waveguide device fabricated on a silicon substrate.
Figure 2A:
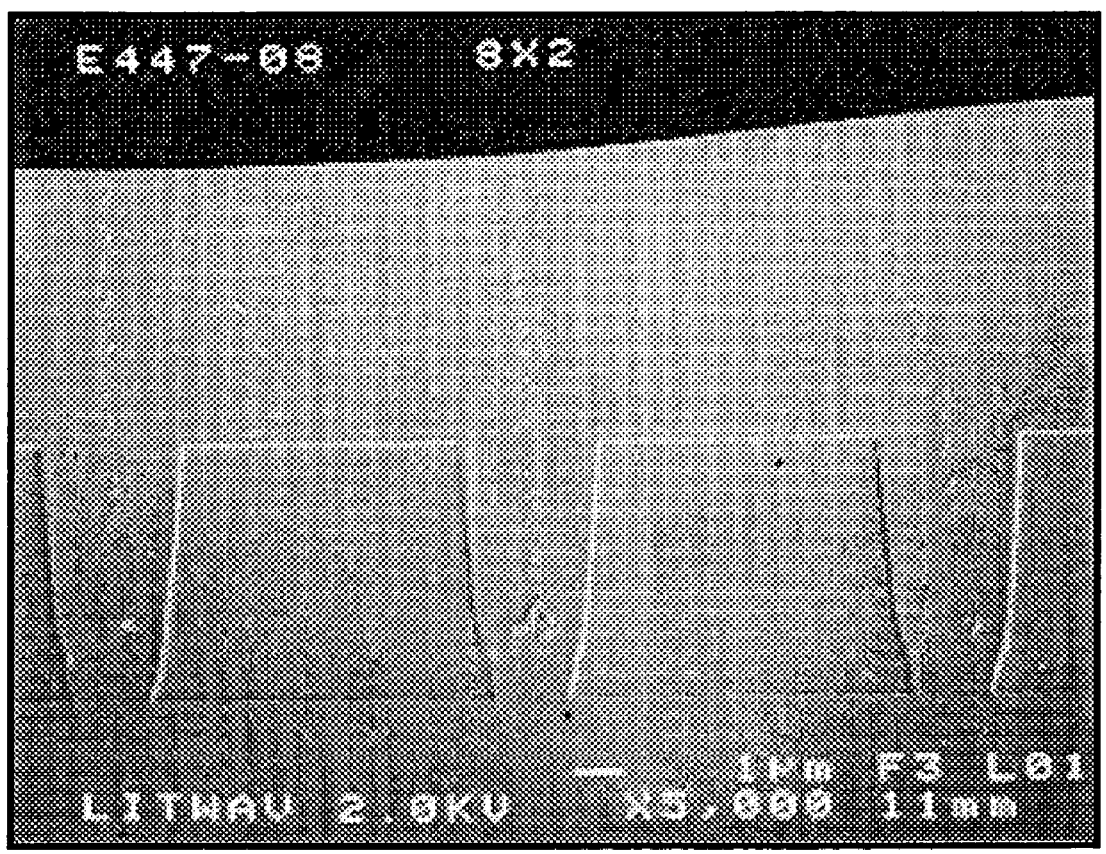
FIG. 2A shows a first side cutaway photograph of prior art waveguide cores and their overlying top cladding layer.
Figure 2B:
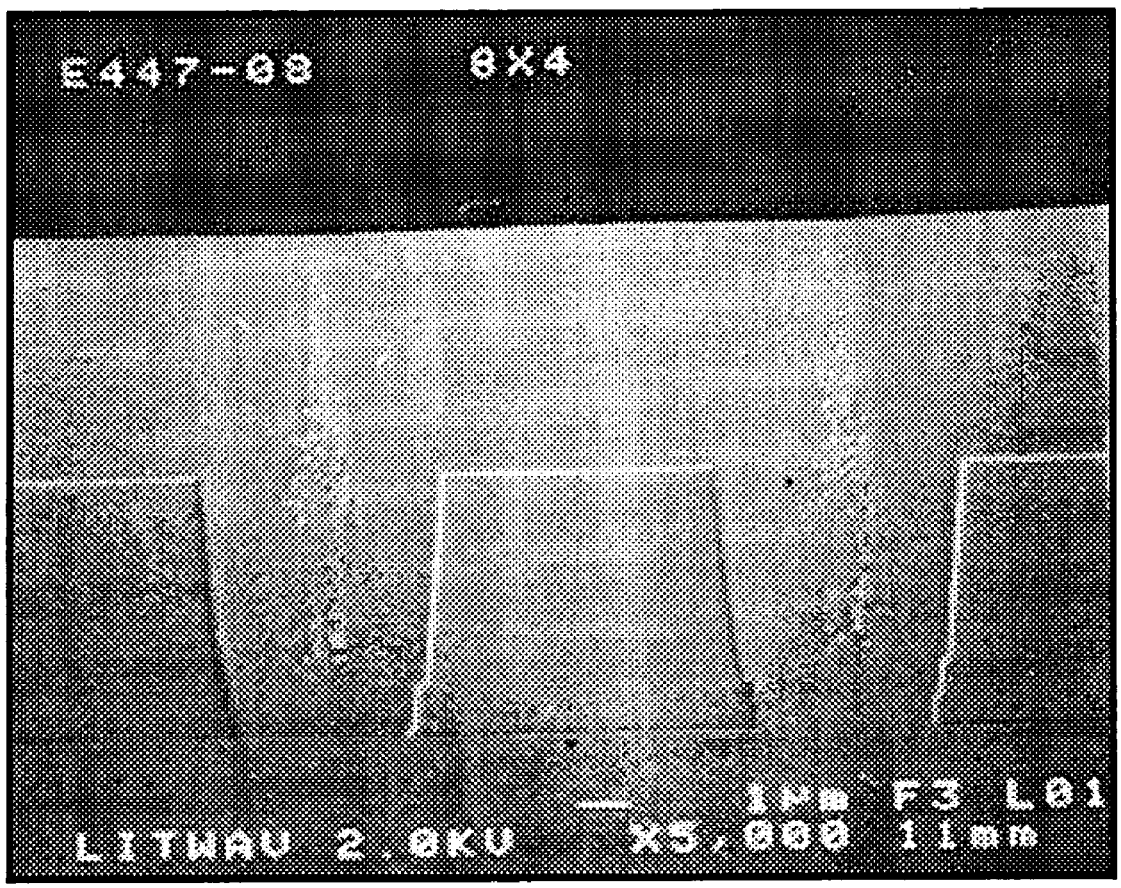
FIG. 2B shows a second side cutaway photograph of prior art waveguide cores and their overlying top cladding layer.
Figure 3:
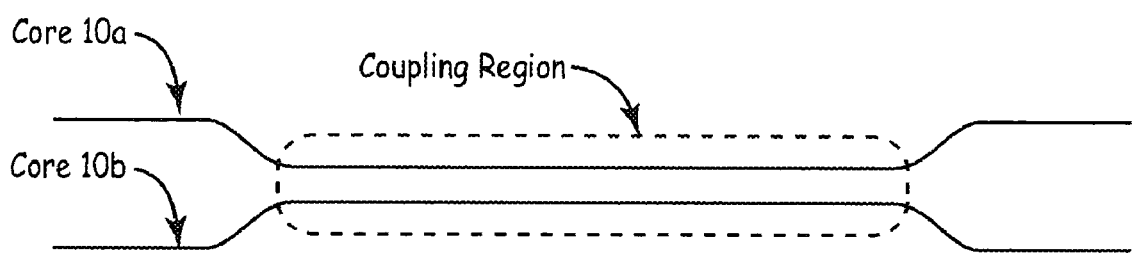
FIG. 3 shows a top-down view of a coupler PLC showing a coupling region between two waveguide cores.
Figure 4:
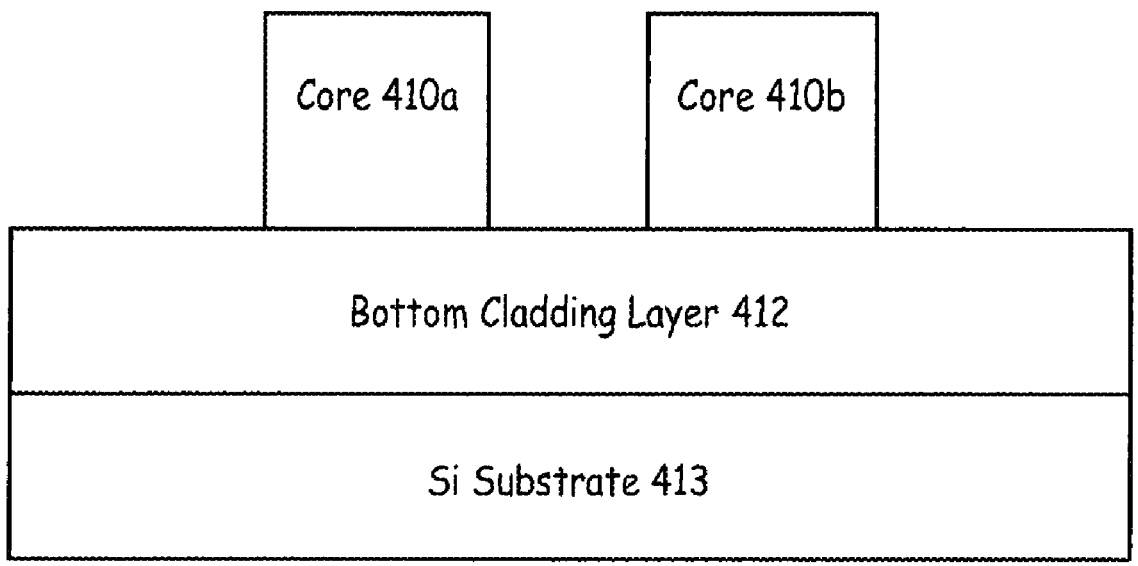
FIG. 4 shows a cross-section view of an optical waveguide structure in accordance with one embodiment of the present invention prior to top cladding layer deposition.

FIG. 4 shows a cross-section view of an optical waveguide structure 400 in accordance with one embodiment of the present invention. As depicted in FIG. 4, optical waveguide structure 400 is shown in a state subsequent to etching to remove a core layer used to form cores 410a and 410b. Cores 410a-b comprise doped $SiO_2$ glass cores formed over a $SiO_2$ bottom cladding layer 412 which is on a silicon substrate 413.

As depicted in FIG. 4, cores 410a-b are disposed close together on bottom cladding layer 412, thereby forming a gap between them (e.g., typically aspect ratio 2-3). It is critical that the gap be effectively filled during the subsequent top cladding layer deposition. As used herein, the term aspect ratio refers to the height of the cores 410a-b divided by the width of the gap between them. For example, in a case where the cores 410a-b are 6 microns high (e.g., from the top of the cores to bottom clad) and the gap is 2 microns wide, the aspect ratio is 3.

AWG devices and active PLC devices are highly dependent upon the precise fabrication of closely spaced waveguide cores such as cores 410a-b. It is critical that the gap between cores 410a-b is uniformly filled by top cladding layer material without voids or seams, and that this gap is free of crystallization defects. The present invention uses a GeBPSG top cladding layer by PECVD process to lay down a top clad.

Figure 5:
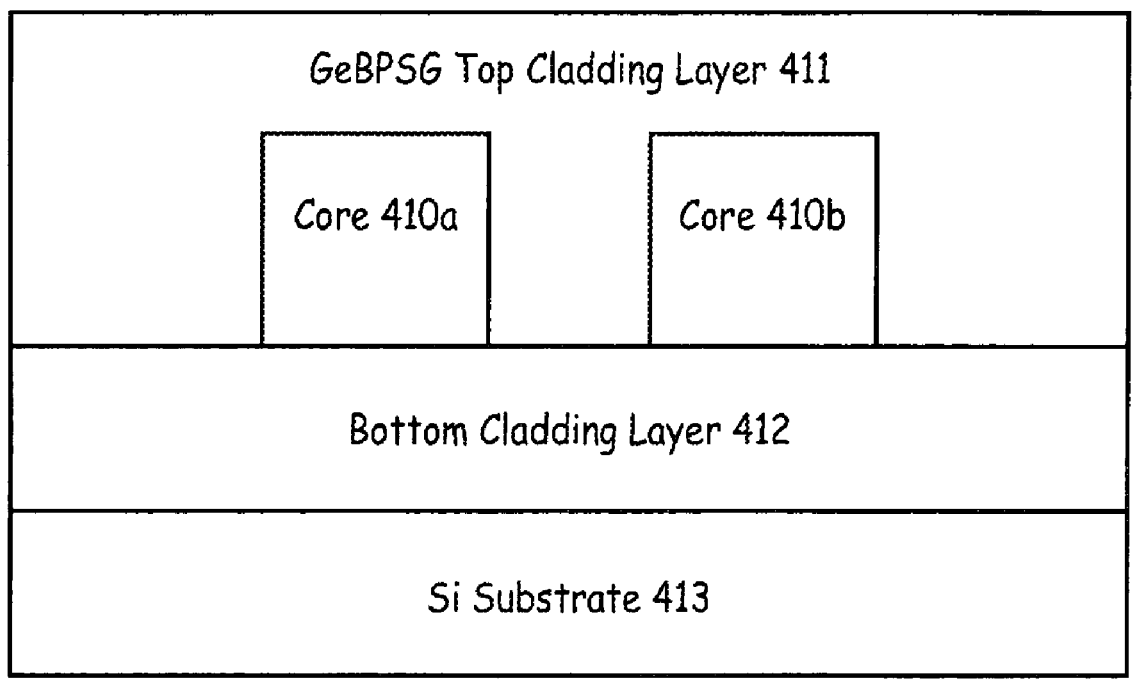
FIG. 5 shows a cross-section view of an optical waveguide structure in accordance with one embodiment of the present invention subsequent to top cladding layer deposition.

FIG. 5 shows a cross-section view of the optical waveguide structure 400 after a GeBPSG top cladding layer in accordance with the present invention. As depicted in FIG. 5, a top cladding layer 411 has been deposited across cores 410a-b and bottom cladding layer 412.

The GeBPSG top cladding layer in accordance with the present invention provides a number of advantages in comparison to the prior art. A first advantage is fact that the GeBPSG top cladding layer effectively fills the gap between the cores 410a-b and eliminates crystallization problems in the low density areas between cores 410a-b. The addition of Ge dopant to the top cladding layer reduces the amount of P dopant in the top cladding layer. High concentrations of P dopant is a major source of crystallization problems, as the phosphorus atoms tend to migrate towards the low density areas and seams between cores 410a-b to form $PBO_4$ crystals. The GeBPSG top cladding layer can completely eliminate the formation of $PBO_4$ crystals.

A second advantage is fact that the GeBPSG top cladding layer can fill the gap between cores 410a-b in four deposition/anneal cycles as opposed to the six to seven cycles required by the prior art. Thus, fewer deposition/anneal cycles are required to fill the gaps between cores 410a-b.

A third advantage is fact that the GeBPSG top cladding layer of the present invention has better refractive index anneal temperature stability in comparison to the prior art. The addition of the Ge dopant reduces the amount of P dopant required in the top cladding layer 412. High concentrations of P dopant in the top cladding layer 412 $SiO_2$ matrix is the major cause of lot-to-lot refractive index control problems. Hence, reducing P dopant concentrations in accordance with the GeBPSG top cladding layer of the present invention increases lot-to-lot refractive index uniformity.

A fourth advantage is fact that the reduced number of deposition/anneal cycles required for the GeBPSG top cladding layer of the present invention increases the throughput of the overall PLC device fabrication line. The increased throughput improves the yield of the overall PLC device fabrication process.

Figure 6:
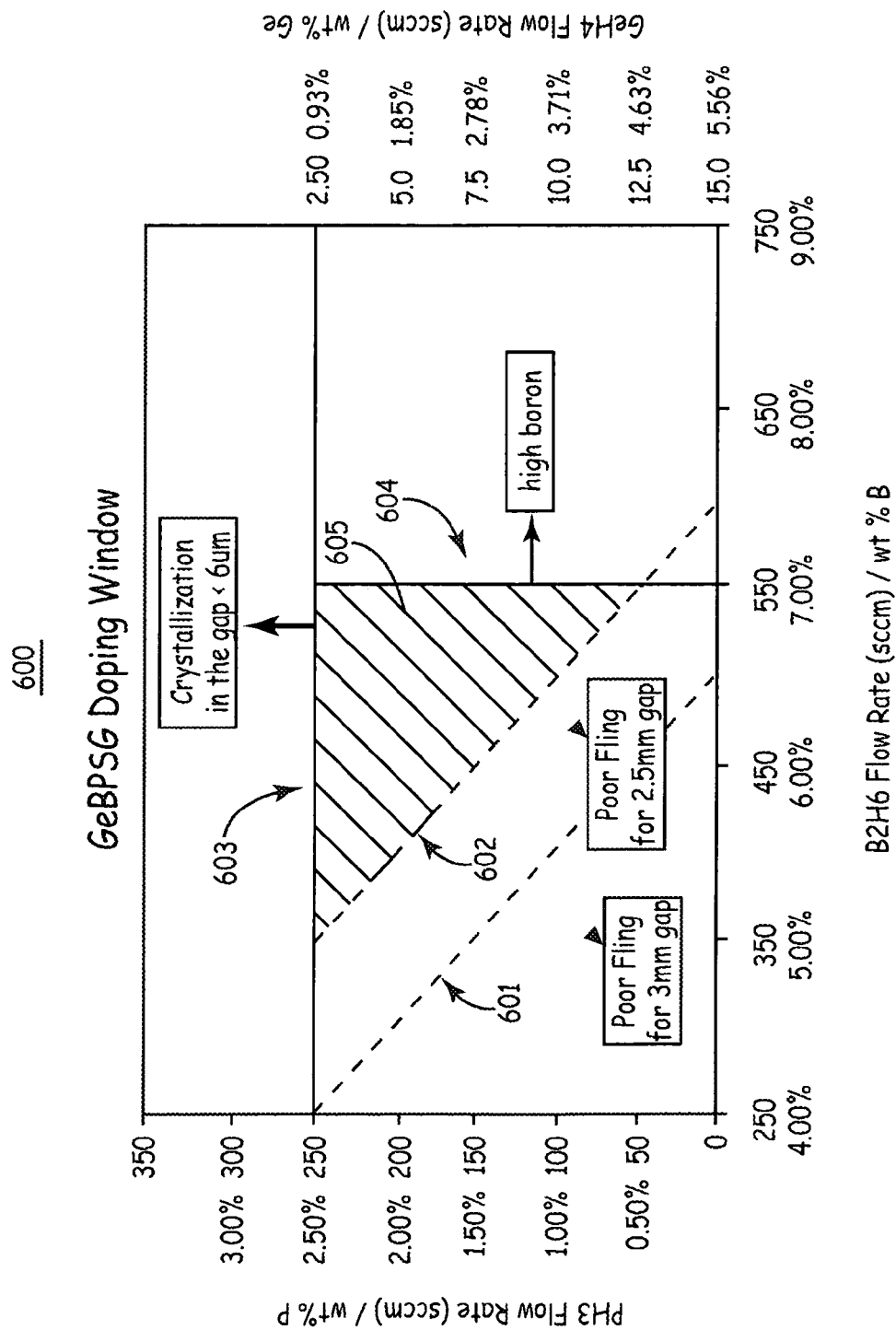
FIG. 6 shows a graph depicting the wt % of P, B, Ge in GeBPSG top cladding layer fabricated by PECVD process.

FIG. 6 shows a graph 600 depicting a doping window as used to prepare GeBPSG top cladding layer by PECVD in accordance with one embodiment of the present invention. In this embodiment, the P dopant gas is $PH_3$, the B dopant gas is $B_2H_6$, and the Ge dopant gas is $GeH_4$.

As depicted in FIG. 6, the wt % of P is shown on the left side of graph 600, the wt % of B is shown on the bottom of graph 600, and the wt % of Ge is shown on the right side of graph 600. Thus, graph 600 shows a map of the concentration of dopants.

As described above, during the deposition of the GeBPSG top cladding layer, the flow rates of the three doping gases (e.g., $GeH_4$, $PH_3$, and $B_2H_6$), are precisely controlled to make the germanoborophosphosilicate glass (GeBPSG) top clad layer match following requirements:
a) the refractive index matching the refractive of the bottom clad layer;
b) free of crystallization within the gaps; and
c) completely filling the gaps having a width of 2.5 microns.

High concentration of P in BPSG causes crystallization problems. By reducing the $PH_3$ flow rate to make wt % of P less than 2.5 and adding $GeH_4$ flow to make wt % of Ge about 1, crystallization in the gap is totally eliminated. A demarcation line, as shown by line 603, is defined on the graph 600. If wt % of P is over 2.5, crystallization in the gap begins to build up. On the other hand, excessively low wt % of P and B in GeBPSG degrades gap filling capability. As shown by line 601, the total wt % of P and B should be larger than 6.5 in GeBPSG in order to fill 3 micron gaps. Below that doping level, poor filling characteristics, such as voids, begin to develop in the gaps. Line 602 shows that total wt % of P and B should be over 7.5 for completely filling the 2.5 micron gaps between waveguide cores. There is a limitation with regard to increasing wt % of B in GeBPSG as shown by line 604. Surface corrosion of GeBPSG develops significantly if wt % of B is larger than 7. Thus, by precisely controlling the flow rate of $GeO_2$, $PH_3$, and $B_2H_6$ to make the wt % of Ge, P and B inside the doping window as shown by the cross-hatched area 605, a high quality GeBPSG top cladding layer can be deposited that is able to fill the 2.5 micron gaps without crystallization.

Figure 7A:
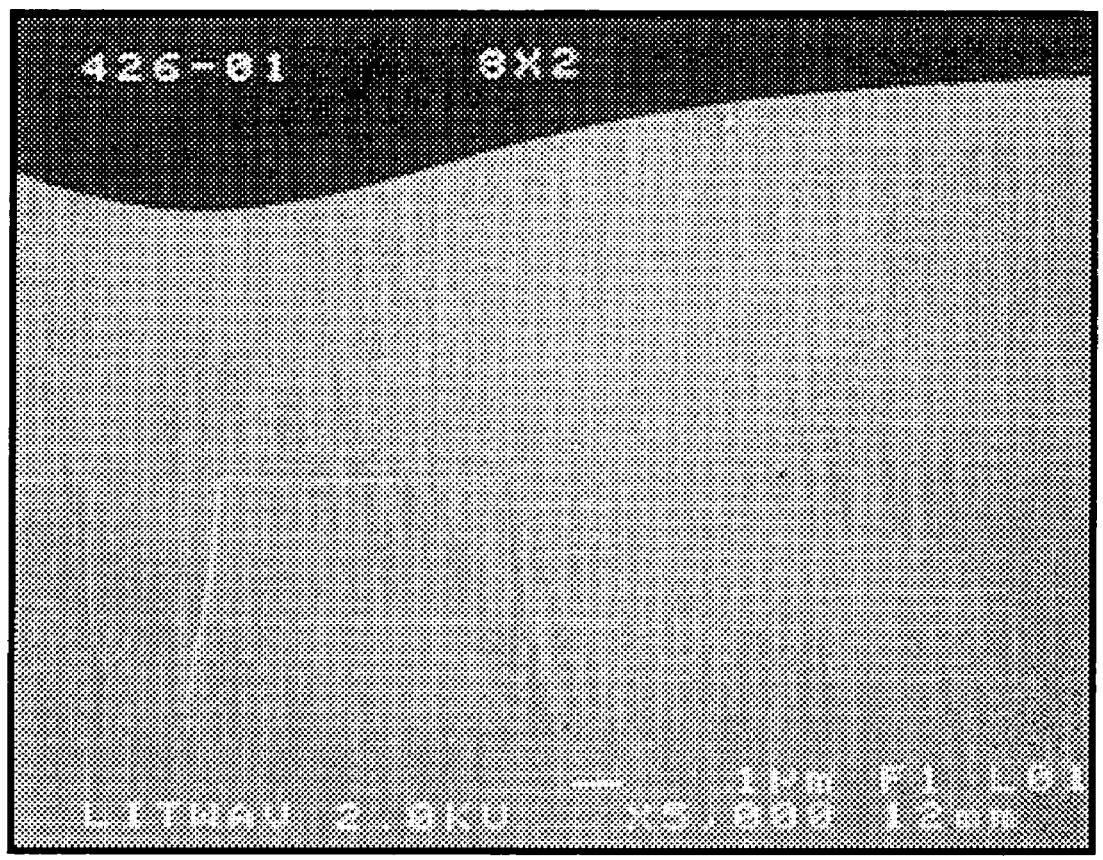
FIG. 7A shows a first side cutaway photograph of a waveguide core and a top cladding layer in accordance with one embodiment of the present invention.
Figure 7B:
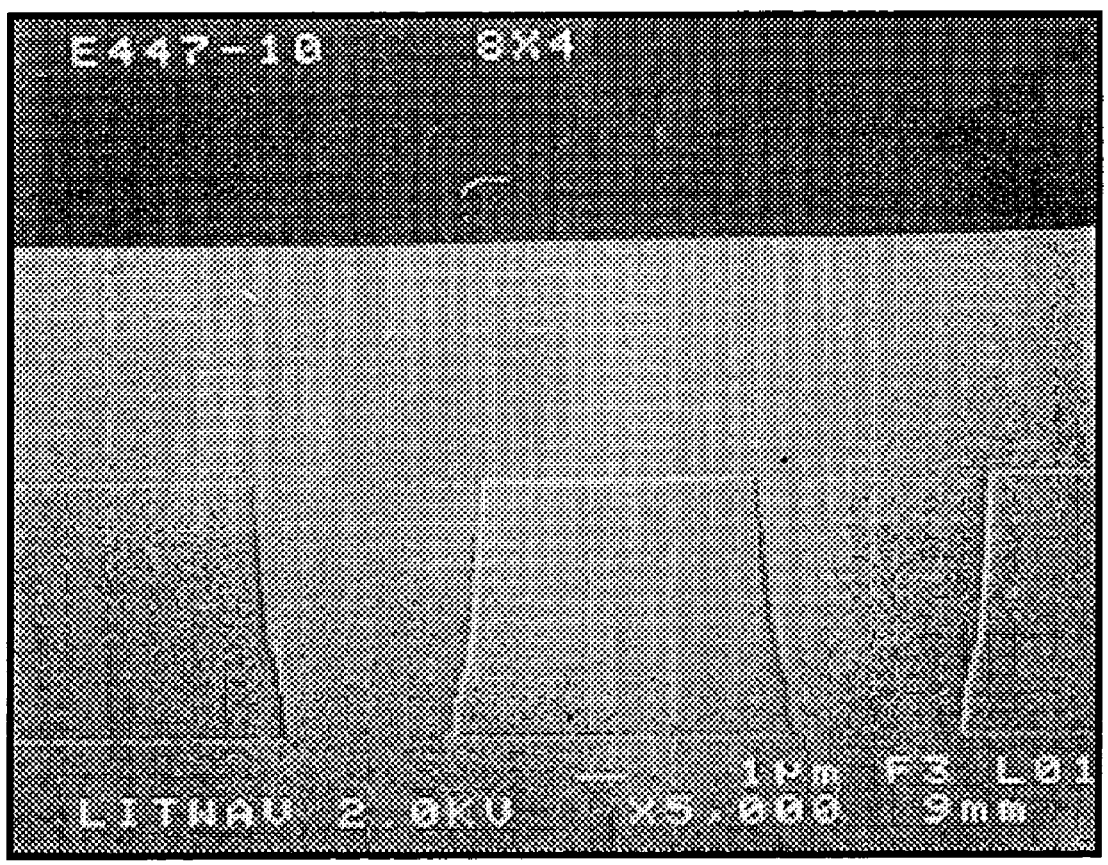
FIG. 7B shows a second side cutaway photograph of a waveguide core and a top cladding layer in accordance with one embodiment of the present invention.

FIG. 7A and FIG. 7B shows a side cutaway photographs of waveguide cores 700 and top clad layer 701 in accordance with one embodiment of the present invention. FIG. 7A shows a case where the gap between cores 700 is 2 microns wide. FIG. 7B shows a case where the gap between cores 700 is 4 microns wide. In both cases, the top cladding layer material between waveguide cores 700 is free of crystallization.

Figure 8:
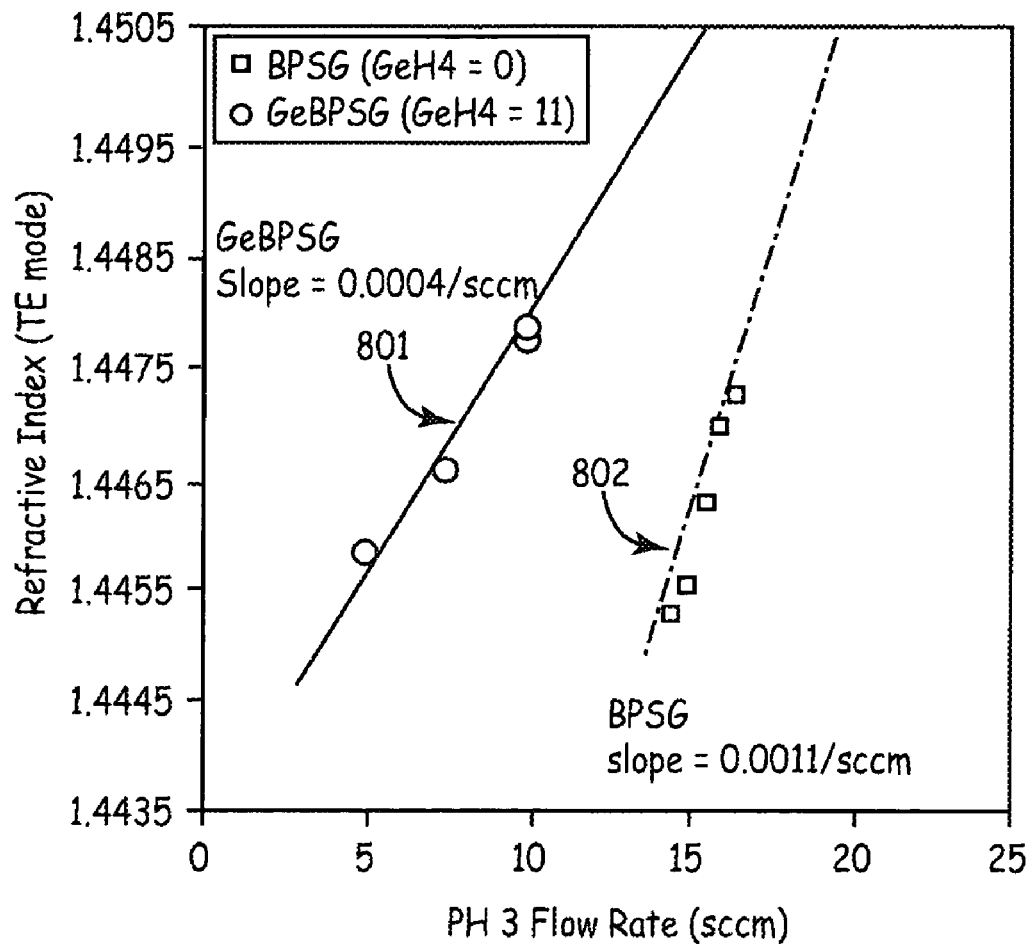
FIG. 8 shows a graph of the refractive index sensitivity of the GeBPSG top cladding layer in accordance with one embodiment of the present invention.

FIG. 8 shows a graph 800 of the difference of refractive index sensitivity between GeBPSG and BPSG top cladding layers. Graph 800 depicts the refractive index (TE mode) sensitivity to different flow rates of $PH_3$ with and without $GeH_4$ flow. The refractive index is shown on the left side of graph 800. The $PH_3$ flow rate is shown on the bottom of graph 800.

Thus by adjusting the flow rates of the P dopant gas and the Ge dopant gas, the refractive index can be tuned and the film stress can be tuned. The sensitivity of the refractive index of GeBPSG to the P dopant gas (e.g., $PH_3$) is about 0.0004/sccm as shown by line 801, which is less than twice that of BPSG with a slope of 0.0011/sccm as shown by line 802. Small sensitivity of refractive index of top cladding layer has an advantage with regard to controlling refractive index uniformity from wafer to wafer and lot to lot. GeBPSG can reduce that refractive index sensitivity by a factor of 2 compared to BPSG, and thus provides better refractive index control for the top cladding layer.

Figure 9:
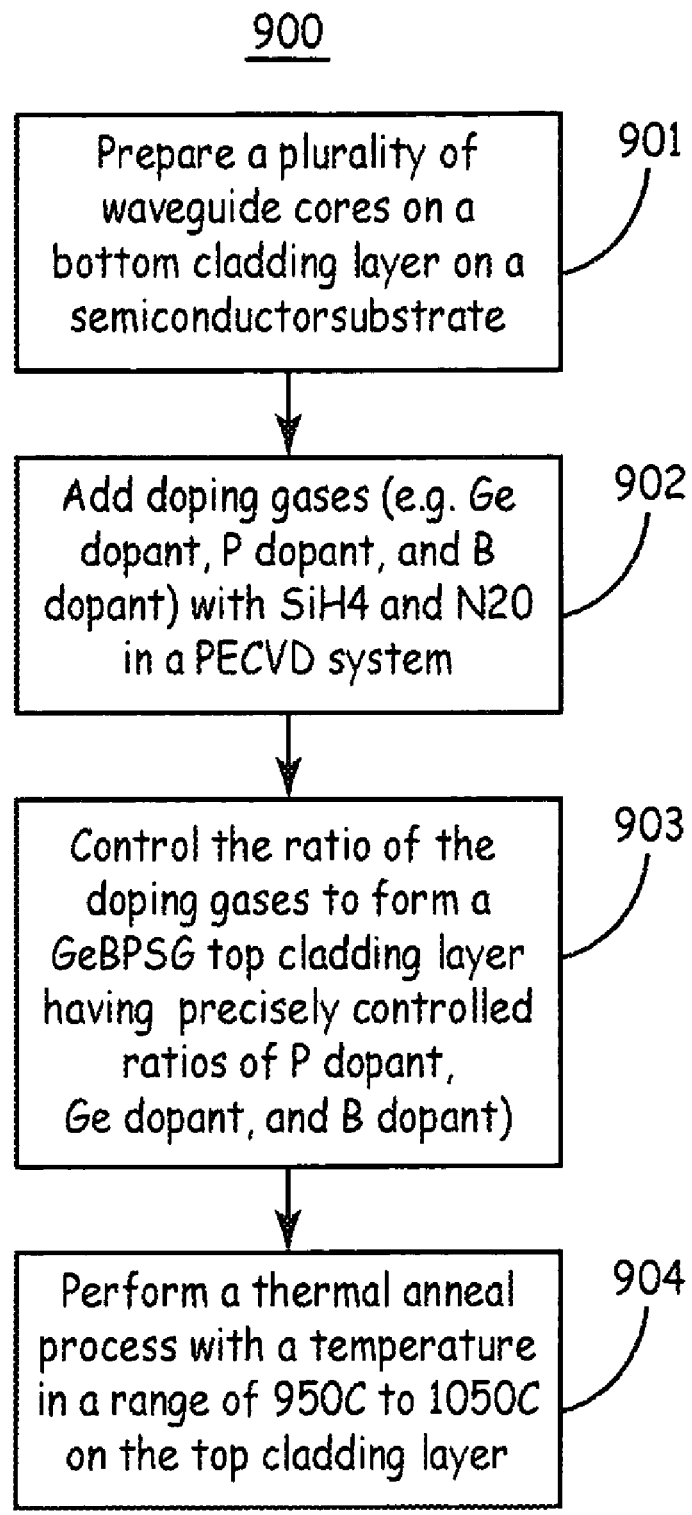
FIG. 9 shows a flowchart of the steps of a GeBPSG top cladding layer deposition process in accordance with one embodiment of the present invention.

Referring now to FIG. 9, a flowchart of the steps of a process 900 in accordance with one embodiment of the present invention is shown. Process 800 depicts the process steps involved in depositing a GeBPSG top cladding layer in accordance with the present invention.

Process 900 begins in step 901, where a plurality of waveguide cores are prepared on a bottom cladding layer on a Si substrate. In step 902, doping gasses (e.g., Ge dopant, P dopant, and B dopant) are added with $SiH_4$ and $N_2O$ in a PECVD system. In step 903, the ratio of the Ge dopant gas, the P dopant gas, and the B dopant gas are controlled to form the GeBPSG top cladding layer having precisely controlled wt % of Ge, P, and B dopants. As described above, the gaps between the cores are filled with no crystallization problems. In step 904, a thermal anneal process is performed with a temperature in a range of 950 C to 1050 C. As described above, the refractive index of GeBPSG is more stable with respect to anneal temperature in comparison to the prior art, and thus, the refractive index control is improved in comparison to the prior art. Additionally, the GeBPSG top cladding layer requires fewer deposition and anneal steps in comparison to prior art, thus improving the yield of the overall PLC device fabrication process.

Thus, the present invention provides a method of depositing a GeBPSG top cladding layer for an optical waveguide of a planar lightwave circuit. The present invention eliminates the formation of crystallization areas within the top cladding layer and increases the refractive index stability of the top cladding layer across an anneal temperature range. The present invention reduces the number of deposition/anneal cycles required to fabricate AWG PLC devices and active PLC devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, thereby to enable others skilled in the art to best utilize the invention and various embodiments with various modifications as are suited to the particular use contemplated. It is intended that the scope of the invention be defined by the claims appended hereto and their equivalents.

What is claimed is:

1. A planar lightwave circuit comprising a first waveguide and a top clad layer, wherein the top clad layer comprises a doped silica glass that is doped with germanium, phosphorous and boron and wherein the doped silica glass has a germanium concentration from 0.93 percent by weight to 5 percent by weight and is free of crystals.

2. The planar lightwave circuit of claim 1 wherein the doped silica glass has a phosphorous concentration from 0.5 weight percent to 2.5 weight percent.

3. The planar lightwave circuit of claim 1 wherein the total concentration for phosphorous and boron is greater than 7.5 weight percent and the boron concentration is less than 7.0 weight percent.

4. The planar lightwave circuit of claim 1 wherein the total concentration for phosphorous and boron is from 7.5 weight percent to 9.0 weight percent.

5. The lightwave circuit of claim 1 wherein the doped silica glass has an anneal temperature from 900° C. to 1050° C.

6. The lightwave circuit of claim 1 further comprising a second waveguide that forms a gap between the first waveguide and the second waveguide.

7. The lightwave circuit of claim 1 wherein the first wave guide comprises a core of doped silica glass.

8. The lightwave circuit of claim 1 wherein the first waveguide partially covers a bottom cladding layer that comprises $SiO_2$.

9. The lightwave circuit of claim 8 wherein the bottom cladding layer is on a silicon substrate.

10. The lightwave circuit of claim 1 wherein the top clad has a TE mode refractive index from 1.4445 to 1.4505.

11. The lightwave circuit of claim 1 wherein the top clad has a TE mode refractive index from 1.4455 to 1.4485.

12. The lightwave circuit of claim 6 wherein the gap is less than 6 microns.

13. The lightwave circuit of claim 6 wherein the gap is from 2 microns to 4 microns.

14. The lightwave circuit of claim 6 wherein the gap has an aspect ratio, defined as the height of the cores divided by the gap between the cores, between 2 and 3.

* * * * *